United States Patent [19]
Nishi et al.

[11] Patent Number: 5,900,673
[45] Date of Patent: May 4, 1999

[54] LOW-TEMPERATURE FUSING BRAZING MATERIAL, AND WIRING BOARD AND SEMICONDUCTOR DEVICE-HOUSING PACKAGE ASSEMBLED WITH THE SAME

[75] Inventors: Koji Nishi, Kokubu; Osamu Watanabe, Tokyo, both of Japan

[73] Assignees: Kyocera Corporation, Kyoto; Tokuriki Honten Co., Ltd., Tokyo, both of Japan

[21] Appl. No.: 08/704,803

[22] Filed: Aug. 26, 1996

[30] Foreign Application Priority Data

Aug. 25, 1995 [JP] Japan .................................. 7-216918

[51] Int. Cl.$^6$ .......................... H01L 23/48; H01L 23/52; H01L 29/40
[52] U.S. Cl. .......................... 257/772; 257/779; 257/706
[58] Field of Search ................... 257/772, 779, 257/706; 148/678, 430, 23, 24

[56] References Cited

U.S. PATENT DOCUMENTS

| 4,872,047 | 10/1989 | Fister et al. ........................... 257/772 |
| 5,049,972 | 9/1991 | Uda et al. ............................. 257/779 |
| 5,550,407 | 8/1996 | Ogashiwa ............................. 257/772 |

FOREIGN PATENT DOCUMENTS

62-148097  7/1987  Japan .

*Primary Examiner*—Mahshid Saadat
*Assistant Examiner*—S. V. Clark
*Attorney, Agent, or Firm*—Loeb & Loeb LLP

[57] ABSTRACT

A low-temperature fusing brazing material containing 10–70% by weight of silver, 10–75% by weight of antimony, 10–50% by weight of indium and/or tin and 0–15% by weight of copper, and wiring boards and semiconductor device-housing packages assembled with the foregoing brazing material.

5 Claims, 1 Drawing Sheet

LOW-TEMPERATURE FUSING BRAZING MATERIAL, AND WIRING BOARD AND SEMICONDUCTOR DEVICE-HOUSING PACKAGE ASSEMBLED WITH THE SAME

BACKGROUND OF THE INVENTION

1. Field of the Invention

The present invention relates to a brazing material which is used for brazing a metal member to another metal member of an electronic component such as a wiring board or a semiconductor device-housing package. More particularly, the present invention is concerned with a brazing material which is used to braze an outer lead terminal, heat sink, etc. to a metallized layer provided on a ceramic substrate.

2. Description of the Related Art

Conventional wiring boards with electronic components such as semiconductor devices, capacitors and resistors mounted or connected thereto are each constructed of a ceramic substrate composed of an aluminum oxide-based sinter, mullite-based sinter, silicon carbide-based sinter, aluminum nitride-based sinter or the like; a metallized wiring layer formed on the upper side of the ceramic substrate in a predetermined pattern, to which a semiconductor device, capacitor, etc. are electrically connected; and an outer lead terminal composed of an iron-nickel-cobalt alloy, iron-nickel alloy or the like which is attached to the metallized wiring layer via a brazing material to connect the metallized wiring layer to an external electric circuit, with a heat-sink member composed of a highly thermal-conductive material such as copper being attached to the underside of the ceramic substrate via a brazing material for satisfactory dissipation of heat generated by the semiconductor device, the resistor, etc. into the air.

Here, the heat-sink member is attached to the underside of the ceramic substrate by precoating the underside of the ceramic substrate with a backing metallized layer and brazing the member to the backing metallized layer via a brazing material.

The metallized wiring layer and the backing metallized layer to which the heat-sink member is brazed are composed of a high-melting metal such as tungsten, molybdenum or manganese, and are applied to the upper side or the underside of the ceramic substrate in a predetermined pattern by the well-known Mo-Mn method of the prior art.

A silver-copper alloy (silver brazing alloy) is usually used as the brazing material for brazing the outer lead terminal to the metallized wiring layer and as the brazing material for brazing the heat-sink member to the backing metallized layer.

Conventional semiconductor device-housing packages for housing semiconductor devices are each composed of a ceramic substrate with a semiconductor device-mounting portion (recessed portion) in the center of the upper side for mounting a semiconductor device; a metallized wiring layer which is formed as a coat extending from the periphery of the semiconductor-mounting portion to the perimeter of the upper side and leading out externally; a semiconductor device which is mounted in the semiconductor-mounting portion and is electrically connected to the metallized wiring layer (via a bonding wire, for example); an outer lead terminal which is attached to the outer end of the metallized wiring layer via a brazing material to connect the semiconductor device to an external electric circuit; and a lid bonded to the upper side of the ceramic substrate via a sealing material, with a heat-sink member which is composed of a highly thermal-conductive material such as copper and serves to satisfactorily dissipate heat generated by the semiconductor device into the air, being attached, via a brazing material, to the underside of the ceramic substrate, which are capable of housing the semiconductor devices in the inside.

Here, the heat-sink member is attached to the underside of the ceramic substrate by precoating the underside of the ceramic substrate with a backing metallized layer and brazing the member to the backing metallized layer via a brazing material.

The ceramic substrate, the outer lead terminal, the metallized wiring layer, the backing metallized layer, the heat-sink member, etc. of the semiconductor device-housing package are formed of the same or similar materials as those used for construction of the wiring board.

In the case of the semiconductor device-housing package as well, a silver-copper alloy (silver brazing alloy) is usually used as the brazing material for brazing the outer lead terminal to the metallized wiring layer and as the brazing material for brazing the heat-sink member to the backing metallized layer.

With the conventional wiring boards or semiconductor device-housing packages, however, when a silver-copper alloy (silver brazing alloy) is used as the brazing material for brazing the outer lead terminal to the metallized wiring layer or brazing the heat-sink member to the backing metallized layer applied to the underside of the ceramic substrate, since the silver-copper alloy has a fusing point as high as 780° C., increased temperatures of the brazing material cause great variation in the degrees of thermal expansion of the ceramic substrate and the heat-sink member and of the ceramic substrate and the outer lead terminal, and this has presented drawbacks in that the ceramic substrate becomes cracked or impaired otherwise, the heat-sink member and the outer lead terminal peel off from the ceramic substrate thus preventing establishment of electric connection between the metallized wiring layer and the external electric circuit, the ceramic substrate is severely bent, and thus the semiconductor device, the capacitor, the resistor, etc. cannot be connected to the metallized wiring layer on the upper side of the ceramic substrate in a firm and precise manner.

SUMMARY OF THE INVENTION

The present inventors have conducted a variety of experiments to find measures to overcome the drawbacks of the prior art mentioned above, and have found that an alloy containing silver, antimony, indium and/or tin at a predetermined weight ratio has a low fusing point, and when this alloy is used to braze the outer lead terminal to the metallized wiring layer provided on the ceramic substrate, or to braze the heat-sink member to the backing metallized layer applied to the underside of the ceramic substrate, the heat-sink member and the outer lead terminal may be firmly brazed while effectively preventing the ceramic substrate from being cracked and greatly bent.

It is an object of the present invention based on this finding to provide a novel brazing material which allows highly firm brazing of a metal member to another metal member without causing great variation in the degrees of thermal expansion between the two metal members.

The brazing material of the present invention is characterized by comprising 10–70% by weight of silver, 10–75% by weight of antimony, 10–50% by weight of indium and/or tin.

The brazing material is further characterized by comprising 15% by weight or less of copper.

The brazing material of invention may further be characterized by consisting essentially of 10–70% by weight of silver, 10–75% by weight of antimony, 10–50% by weight of indium and/or tin, and 0–15% by weight of copper.

The brazing material of invention is also characterized by comprising 10–70% by weight of silver, 10–75% by weight of antimony, 10–50% by weight of indium and/or tin, and 0–15% by weight of copper, and having a fusing point of from about 400 to about 500° C.

The present invention provides a wiring board comprising:

a ceramic substrate which has a region for mounting an electronic component on its upper side, a metallized wiring layer formed as a coat in a predetermined pattern extending from the above region to the center of the upper side and the perimeter of the upper side, and a backing metallized layer formed as a coat so as to cover the underside;

an electronic component which is mounted in the above region and is electrically connected to the metallized wiring layer; an outer lead terminal which is attached to the outer end of the metallized wiring layer via a brazing material to connect the electronic component to the external electric circuit; and a heat sink member attached to the backing metallized layer via a brazing material, characterized in that the brazing material comprises 10–70% by weight of silver, 10–75% by weight of antimony, 10–50% by weight of indium and/or tin, and 0–15% by weight of copper.

The electronic component is, preferably, selected from the group consisting of semiconductor devices, capacitors and resistors.

The present invention also provides a semiconductor device-housing package capable of hermetically housing a semiconductor device in the inside comprising:

a ceramic substrate which has a semiconductor device-mounting portion for mounting a semiconductor device on its upper side, a metallized wiring layer formed as a coat extending from the periphery of the semiconductor device-mounting portion to the perimeter of the upper side and leading out externally, and a backing metallized layer formed as a coat so as to cover the underside;

a semiconductor device which is mounted in the semiconductor-mounting portion and is electrically connected to the inner end of the metallized wiring layer;

an outer lead terminal which is attached to the outer end of the metallized wiring layer via a brazing member to connect the semiconductor device to an external electric circuit;

a lid bonded to the upper side of the ceramic substrate via a sealing material; and a heat sink member attached to the backing metallized layer via a brazing material, characterized in that the brazing material comprises 10–70% by weight of silver, 10–75% by weight of antimony, 10–50% by weight of indium and/or tin, and 0–15% by weight of copper.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
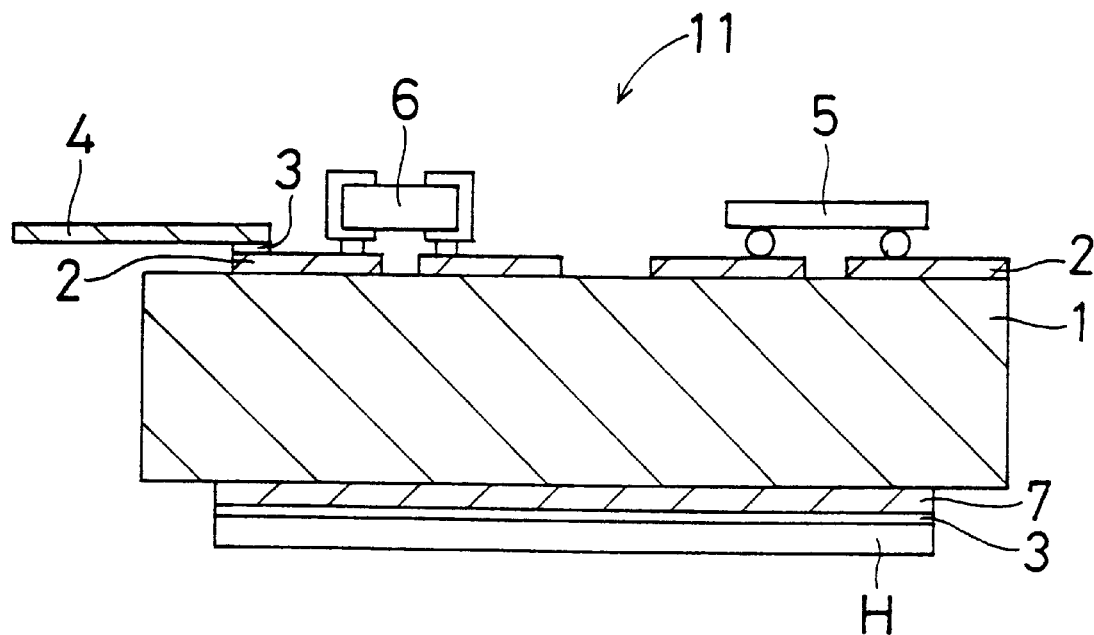
FIG. 1 is a cross sectional view illustrative of an example of the wiring board as an embodiment of the present invention which is constructed using a brazing material according to the present invention.

Now referring to the drawings, preferred embodiments of the invention are described below.

Silver (Ag), antimony (Sb), indium (In), tin (Sn) and copper (Cu) as the raw materials were mixed in the proportions listed in Table 1 through Table 4, and the mixtures were fused in a Tammann furnace to manufacture ingots which were then worked by cutting or rolling and processed by annealing into specimens of brazing materials 0.5-mm thick×25-cm wide×25-mm long.

Here, the specimen No. 28, which is a comparative specimen for comparison with those of the invention, is a silver-copper alloy (silver brazing alloy) which is a conventional brazing material.

The respective resulting specimens of brazing materials were heated at a temperature increase rate of 30° C./min. to measure the fusing temperatures of the respective specimens of brazing materials while examining the surfaces of the fused and solidified brazing materials under a microscope to determine whether pin-holes, voids, etc. had been produced.

Metal pieces made of copper (Cu) 1-mm thick×25-mm wide×25-mm long were brazed to 25 mm×25 mm tungsten-metallized layers applied to the surfaces of ceramic substrates composed of 2-mm thick mullite-based sinters, using the respective specimens of brazing materials in a reducing atmosphere or in a vacuum, and the surfaces of the ceramic substrates were then examined under a microscope to calculate the fraction of defective products based on the number of cracked ceramic substrates.

Here, the surfaces of the metallized layers were precoated with 1.5-$\mu$m thick nickel-plating layers and 1-$\mu$m thick gold-plating layers in succession.

The results are summarized in Table 1 through table 4.

TABLE 1

| Specimen No. | Composition of brazing materials (weight %) | | | | | Fusing temperature (° C.) |
|---|---|---|---|---|---|---|
| | Ag | Sb | In | Sn | Cu | |
| *1 | 5 | 75 | — | 20 | — | 515 |
| *2 | 10 | 80 | 10 | — | — | 535 |
| *3 | 10 | 30 | — | 60 | — | 334 |
| *4 | 30 | 65 | — | 5 | — | 535 |
| 5 | 10 | 70 | — | 20 | — | 485 |
| 6 | 10 | 65 | 20 | — | 5 | 482 |
| 7 | 10 | 60 | 30 | — | — | 473 |
| 8 | 10 | 60 | — | 30 | — | 453 |
| 9 | 10 | 60 | — | 20 | 10 | 487 |
| 10 | 10 | 40 | — | 40 | 10 | 395 |
| 11 | 10 | 40 | 20 | 20 | 10 | 439 |
| 12 | 30 | 60 | 10 | — | — | 462 |
| 13 | 30 | 55 | — | 10 | 5 | 495 |
| 14 | 30 | 45 | 20 | — | 5 | 423 |
| 15 | 30 | 30 | — | 40 | — | 406 |
| 16 | 30 | 20 | 20 | 30 | — | 416 |
| 17 | 30 | 10 | 10 | 40 | 10 | 405 |
| 18 | 50 | 40 | — | 10 | — | 452 |
| 19 | 50 | 30 | — | 15 | 5 | 457 |
| 20 | 50 | 20 | 25 | — | 5 | 428 |
| 21 | 50 | 10 | 40 | — | — | 442 |
| 22 | 50 | 10 | 20 | 20 | — | 450 |

The specimen numbers marked with * indicate that the specimens are outside of the scope of the invention.

TABLE 2

| Specimen No. | Composition of brazing materials (weight %) | | | | | Fusing temperature (° C.) |
| --- | --- | --- | --- | --- | --- | --- |
| | Ag | Sb | In | Sn | Cu | |
| 23 | 70 | 15 | — | 15 | — | 485 |
| 24 | 70 | 15 | 5 | 10 | — | 469 |
| 25 | 70 | 10 | — | 10 | 10 | 487 |
| *26 | 70 | 5 | — | 25 | — | 536 |
| *27 | 80 | 10 | — | 10 | — | 689 |
| *28 | Ag: 72, Cu: 28 | | | | | 780 |

The specimen numbers marked with * indicate that the specimens are outside of the scope of the invention.

TABLE 3

| Specimen No. | Rate of cracked ceramic substrates (%) | State of brazing materials |
| --- | --- | --- |
| *1 | 20 | Fused apart and honeycombed |
| *2 | 40 | Voids formed |
| *3 | 0 | Fused apart and honeycombed |
| *4 | 20 | Fused apart and honeycombed |
| 5 | 0 | Good |
| 6 | 0 | Good |
| 7 | 0 | Good |
| 8 | 0 | Good |
| 9 | 0 | Good |
| 10 | 0 | Good |
| 11 | 0 | Good |
| 12 | 0 | Good |
| 13 | 0 | Good |
| 14 | 0 | Good |
| 15 | 0 | Good |
| 16 | 0 | Good |
| 17 | 0 | Good |
| 18 | 0 | Good |
| 19 | 0 | Good |
| 20 | 0 | Good |
| 21 | 0 | Good |
| 22 | 0 | Good |

The specimen numbers marked with * indicate that the specimens are outside of the scope of the invention.

TABLE 4

| Specimen No. | Rate of cracked ceramic substrates (%) | State of brazing materials |
| --- | --- | --- |
| 23 | 0 | Good |
| 24 | 0 | Good |
| 25 | 0 | Good |
| *26 | 20 | Good |
| *27 | 40 | Good |
| *28 | 80 | Good |

The specimen numbers marked with * indicate that the specimens are outside of the scope of the invention.

As is apparent from the listed examples, the use of the conventional silver-copper alloy (silver brazing alloy) having an extremely high fusing temperature of 780° C. results in production of cracks in 80% or more of the ceramic substrates.

On the other hand, the use of a brazing material according to the invention of which fusing temperature is as low as about 400–about 500° C. neither causes cracking of the ceramic substrates, nor forms fracture of the brazing material due to fusing thereof, honeycombs and voids.

The constituent silver (Ag) of the brazing material of the invention, which is a component for controlling the hardness and the fusing point of the brazing material and increasing the corrosion resistance of the brazing material, causes fusing-apart of the brazing material and formation of a plurality of pin-holes, voids and/or honeycombs when the proportion is less than 10% by weight, whereas the fusing point of the brazing material becomes excessively high at proportions over 70% by weight. Accordingly, the silver content of the brazing material must be within the range of 10–70% by weight.

In contrast, antimony (Sb) in the brazing material, which is a component for controlling the fusing point of the brazing material, increases the fusing point of the brazing material when it is present at a proportion of less than 10% by weight or more than 75% by weight. Accordingly, the antimony content of the brazing material must be within the range of 10–75% by weight.

In addition, indium (In) and tin (Sn) in the brazing material, which are components for controlling the fusing point of the brazing material and improving the wettability with the metal members, cause fusing-apart of the brazing material and further formation of a plurality of pin-holes, voids and/or honeycombs during brazing when they are present at proportions less than 10% by weight or more than 50% by weight. Accordingly, indium and tin must be present in the brazing material at proportions within the range of 10–50% by weight.

The surface flatness of the brazing material of the invention is increased to improve the wettability with the metal members when copper is added at a proportion of 15% by weight or less. Accordingly, the brazing material preferably contains 15% by weight or less of added copper.

An example of application of the brazing material of the invention to wiring boards or semiconductor device-housing packages, which lies within the scope of the invention as well, will now be explained.

In FIG. 1 illustrative of an embodiment of the wiring board according to the invention, 1 indicates a ceramic substrate, 2 indicates a metallized wiring layer, 3 indicates a brazing material layer, 4 indicates an outer lead terminal, 5 indicates a semiconductor device, 6 indicates a capacitor, 7 indicates a backing metallized layer, and H indicates a heat-sink member. A wiring board 11 is assembled with these members. The metallized layer 2 is formed as a coat in a predetermined pattern extending from the mounting region in the upper side of the ceramic substrate 1 for mounting the semiconductor device 5, the capacitor 6, etc. to the center of the upper side and the perimeter of the upper side. The outer lead terminal 4 is attached to part (outer end) of the metallized wiring layer 2 via the brazing material layer 3 composed of a brazing material of the invention. The metallized wiring layer 2 electrically connects the semiconductor device 5 to the outer lead terminal 4, and the capacitor 6 to the semiconductor device 5. The surface of the metallized wiring layer 2 may be coated with thin films of nickel plating and gold plating.

The backing metallized layer 7 is formed on the underside of the ceramic substrate 1 as a coat, and further the heat sink member H is attached to the former via the brazing material layer 3 composed of a brazing material of the invention. With the configuration described above, the heat sink member H absorbs heat generated during operation of the semiconductor device 5 and the capacitor 6, and dissipates the heat into the air.

The brazing material of the invention, which has a fusing temperature significantly lower than the fusing temperatures of brazing materials of the prior art, prevents bending of the ceramic substrate 1 and cracking of the sections of bonding without causing great variation in the degrees of thermal expansion of the members when the brazing material is used to bond the respective members.

Figure 2:
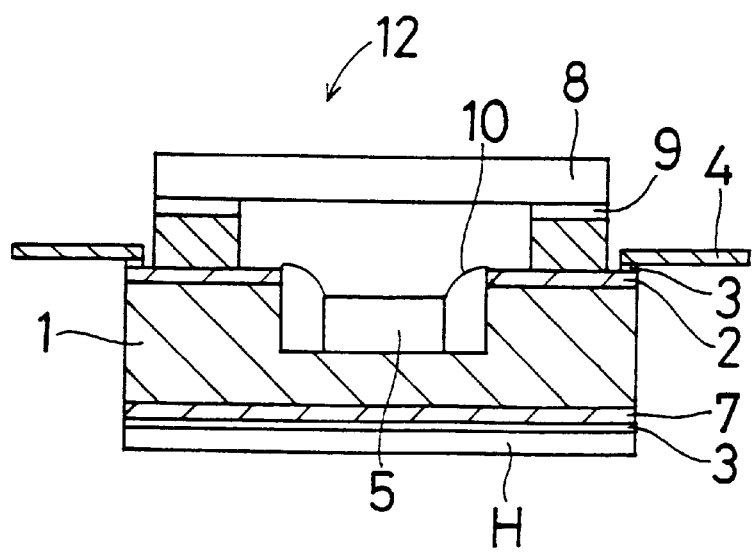
FIG. 2 is a cross sectional view illustrative of an example of the semiconductor device-housing package as another embodiment of the invention which is constructed using a brazing material according to the invention.

In FIG. 2 illustrative of an embodiment of the semiconductor device-housing package according to the invention, 1 indicates a ceramic substrate, 2 indicates a metallized wiring layer, 3 indicates a brazing material layer, 4 indicates an outer lead terminal, 5 indicates a semiconductor device, 7 indicates a backing metallized layer, 8 indicates a lid, and H indicates a heat-sink member. The ceramic substrate 1 and the lid 8 comprises an insulated container 12 for housing the semiconductor device 5.

The ceramic substrate 1 has a recessed portion for housing the semiconductor device 5 in the center of the upper side thereof, and the semiconductor device 5 is firmly bonded to the bottom of the recessed portion via a resin-made adhesive or the like. The metallized wiring layer 2 is formed on the upper side of the ceramic substrate 1 as a coat extending from the inside to the outside of the recessed portion. The outer lead terminal 4 is attached to part (outer end) of the metallized wiring layer 2 via the brazing material layer 3 formed of a brazing material of the invention.

The semiconductor device 5 is electrically connected to the metallized wiring layer 2 via a bonding wire 10, the metallized wiring layer 2 is further connected to the outer lead terminal 4, while an external electric circuit is connected to the outer lead terminal 4.

The lid 8, which is attached to the upper side of the ceramic substrate 1 by bonding with a sealing material 9 (e.g., an epoxy resin), covers the recessed portion of the ceramic substrate 1 to hermetically seal the inside of the insulated container 12, thereby hermetically housing the semiconductor device inside the container 12.

The backing metallized layer 7 is formed on the underside of the ceramic substrate 1 as a coat, and further the heat sink member H is attached to the former via the brazing material layer 3 of the invention. With the configuration described above, the heat sink member H absorbs heat generated during operation of the semiconductor device 5, and dissipates the heat into the air.

The use of a brazing material of the invention prevents bending of the ceramic substrate 1, cracking of the site of bonding with the brazing material, just as is the case of the wiring board 11.

As described above, since the brazing material of the invention comprises 10–70% by weight of silver, 10–75% by weight of antimony and 10–50% by weight of indium and/or tin, the fusing temperature of the brazing material is low, and thus, when, for example, the outer lead terminal is brazed to the metallized wiring layer provided on the ceramic substrate, or the heat-sink member is brazed to the backing metallized layer applied to the underside of the ceramic substrate with the brazing material of the invention to construct a wiring board or a semiconductor device-housing package, high heat is never applied to the ceramic substrate on which the metallized layer is provided or to the heat-sink member, and a great difference is never created between the degrees of thermal expansion of the ceramic substrate on which the backing metallized layer is provided and the heat-sink member, or of the ceramic substrate and the outer lead terminal. Accordingly, the heat-sink member and the outer lead terminal are firmly brazed without failure, without cracking the metallized layer which coats the ceramic substrate or the ceramic substrate itself, while the ceramic substrate is kept flat at all times, thus allowing firm and precise connection of the semiconductor, the capacitor, the resistor, etc. to the metallized wiring layer on the upper side of the ceramic substrate.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A brazing material comprising about 10–70% by weight of silver, about 10–75% by weight of antimony, and about 10–50% by weight of indium.

2. The brazing material of claim 1, comprising not greater than about 15% by weight of copper.

3. A brazing material comprising about 10–70% by weight of silver, about 10–75% by weight of antimony, about 10–50% by weight of indium, and about 0–15% by weight of copper, the brazing material having a fusing point of between about 400° C. and about 500° C.

4. A wiring board, comprising:
a ceramic substrate having a first side, a second side and a mounting region for mounting an electronic component on the first side, a metallized wiring layer formed in a predetermined pattern extending from the mounting region to the first side, and a backing metallized layer covering at least a portion of the second side,
an electronic component mounted in the mounting region and electrically connected to the metallized wiring layer,
an outer lead terminal attached to an outer end of the metallized wiring layer via a brazing material, whereby the electronic component is connectable to an external electric circuit, and
a heat sink attached to the backing metallized layer via a brazing material, the brazing material comprising about 10–70% by weight of silver, about 10–75% by weight of antimony, about 10–50% by weight of indium, and about 0–15% by weight of copper.

5. A semiconductor device housing package for hermetically housing a semiconductor device, comprising:
a ceramic substrate having a first side, a second side and a semiconductor device mounting portion for mounting a semiconductor device on the first side, a metallized wiring layer extending from a periphery of the semiconductor device mounting portion to a perimeter of the first side and leading out externally, and a backing metallized layer covering the second side,
a semiconductor device mounted in the semiconductor mounting portion and electrically connected to an inner end of the metallized wiring layer,
an outer lead terminal attached to an outer end of the metallized wiring layer via a brazing material, whereby the semiconductor device is connectable to an external electric circuit,
a lid bonded to the first side of the ceramic substrate via a sealing material, and
a heat sink attached to the backing metallized layer via a brazing material, the brazing material comprising about 10–70% by weight of silver, about 10–75% by weight of antimony, about 10–50% by weight of indium, and about 0–15% by weight of copper.

* * * * *